(12) United States Patent
Malik

(10) Patent No.: US 7,919,840 B2
(45) Date of Patent: Apr. 5, 2011

(54) INTEGRATED NON-ISOLATED VRM AND MICROPROCESSOR ASSEMBLY

(75) Inventor: Randhir S. Malik, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 592 days.

(21) Appl. No.: 11/942,927

(22) Filed: Nov. 20, 2007

(65) Prior Publication Data
US 2009/0129027 A1 May 21, 2009

(51) Int. Cl.
H01L 23/02 (2006.01)

(52) U.S. Cl. .............. 257/678; 257/720; 257/E23.031

(58) Field of Classification Search .............. 257/675, 257/678, 685, 686, 690, 691, 692, 693, 700, 257/738, 758, 777–781, 718–720, E23.031, 257/E23.08, E23.101; 361/704, 709, 306.2, 361/760
See application file for complete search history.

(56) References Cited

U.S. PATENT DOCUMENTS

| | | | |
|---|---|---|---|
| 5,097,303 A | 3/1992 | Taguchi | |
| 5,556,811 A | 9/1996 | Agatstein et al. | |
| 6,278,264 B1 | 8/2001 | Burstein et al. | |
| 6,452,804 B1 | 9/2002 | Dibene, II et al. | |
| 6,677,809 B2 | 1/2004 | Perque et al. | |
| 6,801,025 B2 | 10/2004 | Carballo et al. | |
| 2001/0054760 A1 | 12/2001 | Ito et al. | |
| 2002/0057554 A1 | 5/2002 | Dibene, II et al. | |
| 2003/0039092 A1 | 2/2003 | Kanouda et al. | |
| 2003/0081389 A1 | 5/2003 | Nair et al. | |
| 2003/0110452 A1 | 6/2003 | Leahy et al. | |
| 2003/0156400 A1 | 8/2003 | Dibene, II et al. | |
| 2003/0181075 A1 | 9/2003 | Hartke et al. | |
| 2004/0159894 A1 | 8/2004 | Blisson et al. | |
| 2005/0018406 A1* | 1/2005 | Harris ........................ 361/719 |

FOREIGN PATENT DOCUMENTS

JP   2002-233140 A   8/2002

* cited by examiner

Primary Examiner — Thao X Le
Assistant Examiner — Hoa B Trinh
(74) Attorney, Agent, or Firm — Cynthia S. Seal; Hoffman Warnick LLC

(57) ABSTRACT

The present invention provides one single chip solution for a non-isolated DC-DC regulator. The advantage is high reliability, lower cost and smaller space on the motherboard. This integrated solution opens the door for a distributed architecture with few millimeter high 1"×1" regulator. Such regulators could be populated as QFP ICs are on all system boards. The present invention is based on a single VRM chip, PBGA multilayer board with processor signal pads and power points. The multilayer board periphery has SMD components such as ceramic capacitors, ICs, MOSFETs and a rectangular metal heat sink along with ferrite cores which sandwich the multilayer board and SMDs to form inductors for the multiphase solution.

9 Claims, 3 Drawing Sheets

Figure 1: A typical non-isolated VRM

Figure 2 An Integrated BGA VRM using planar magnetics and single IC using Controller and 4 MOSFETs

INTEGRATED NON-ISOLATED VRM AND MICROPROCESSOR ASSEMBLY

BACKGROUND OF THE INVENTION

1. Field of the Invention

The present invention generally relates to voltage regulator modules (or VRMs) for regulating voltage provided to microprocessors and, more particularly an integrated non-isolated VRM and microprocessor assembly.

2. Related Art

A voltage regulator module or VRM, sometimes called PPM (power processing module) is an electronic device that provides a microprocessor the appropriate supply voltage. It can be soldered to the motherboard or be an installable device. It allows processors with different supply voltage to be mounted on the same motherboard. (A motherboard is the central or primary circuit board making up a complex electronic system, such as a modern computer. It is also known as a mainboard, baseboard, system board, or, on Apple® computers, a logic board.)

Some voltage regulators provide a fixed supply voltage to the processor, but most of them sense the required supply voltage from the processor. In particular, VRMs that are soldered to the motherboard are supposed to do the sensing.

The correct supply voltage is communicated by the microprocessor to the VRM at startup via a number of bits called VID (voltage identifier). In particular, the VRM initially provides a standard supply voltage to the VID logic, which is the part of the processor whose only aim is to then send the VID to the VRM. When the VRM has received the VID identifying the required supply voltage, it starts acting as a voltage regulator, providing the required constant voltage supply to the processor.

However, because systems of the prior art utilize a discrete assembly which uses a discrete controller, inductors, capacitors, and MOSFETs, the DC-DC regulation is not reliable. (The metal-oxide-semiconductor field-effect transistor (MOSFET, MOS-FET, or MOS FET) is by far the most common field-effect transistor in both digital and analog circuits.) Because of the unreliability of the discrete assembly, redundant VRMs are required for availability. In addition, discrete assemblies require a lot of motherboard space.

FIG. 1 illustrates a discrete assembly 100 of the prior art. As discussed above, the discrete assembly on motherboard 101 comprises discrete components such as discrete controller 102, inductors L1 104, capacitors C1, C2 106, and MOSFETs Q1, Q2 108.

Another problem of the prior art is the expense of a discrete connector and VRM to power the microprocessor. Further drawbacks of the known solutions include the large size, thermal issues and reliability of the VRM.

Therefore, there exists a need for a solution that solves at least one of the deficiencies of the related art.

SUMMARY OF THE INVENTION

In general, the present invention provides one single chip solution for a non-isolated DC-DC regulator. The advantage is high reliability, lower cost and smaller space on the motherboard. This integrated solution opens the door for a distributed architecture with few millimeter high 1"×1" regulator. Such regulators could be populated as QFP ICs are on all system boards. (A QFP or Quad Flat Package is an integrated circuit package with leads extending from each of the four sides. It is used for surface mounting (SMD) only, socketing or hole mounting is not possible. There are versions having from 32 to over 200 pins with a pitch ranging from 0.4 to 1.0 mm. Special cases include LQFP (Low profile QFP) and TQFP (Thin QFP)). The integrated VRM of the present invention provides a reliable DC-DC regulator because of a single package construction compared to the discrete assembly of the prior art discussed above. By integrating all solid state devices in a single chip, the reliability is high enough to avoid redundant VRMs for availability. Also, the space needed on the motherboard is ⅕ of the space required by the discrete implementation of the prior art.

The present invention is based on a single VRM chip, PBGA multilayer board which processor signal pads and power points. The multilayer board periphery has SMD components such as ceramic capacitors, ICs, MOSFETs and a rectangular metal heat sink along with ferrite cores to form inductors for the multiphase solution. (Surface mount technology (SMT) is a method for constructing electronic circuits in which the components (SMCs, or Surface Mounted Components) are mounted directly onto the surface of printed circuit boards (PCBs). Electronic devices so made are called surface-mount devices or SMDs.)

BRIEF DESCRIPTION OF THE DRAWINGS

These and other features of this invention will be more readily understood from the following detailed description of the various aspects of the invention taken in conjunction with the accompanying drawings in which.

Figure 1:
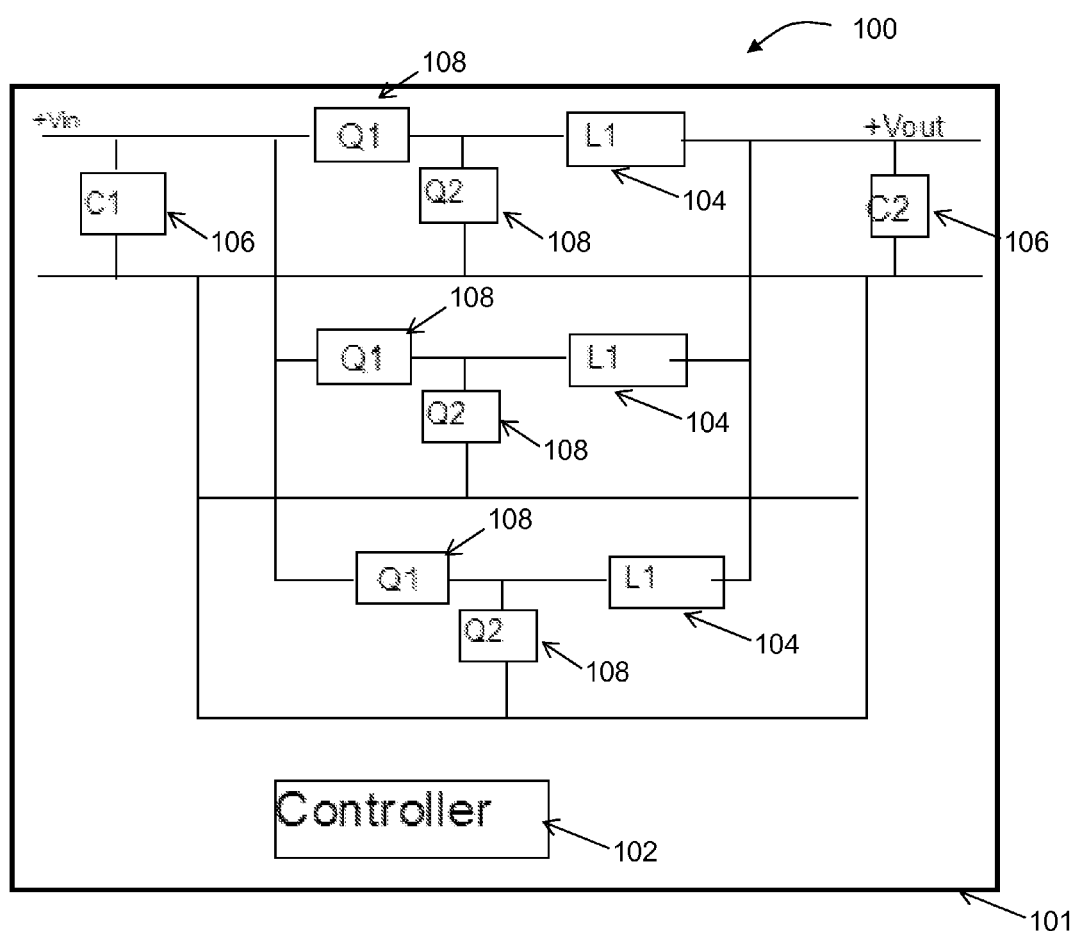
FIG. 1 illustrates a discrete assembly of the prior art.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE DRAWINGS

Figure 2:
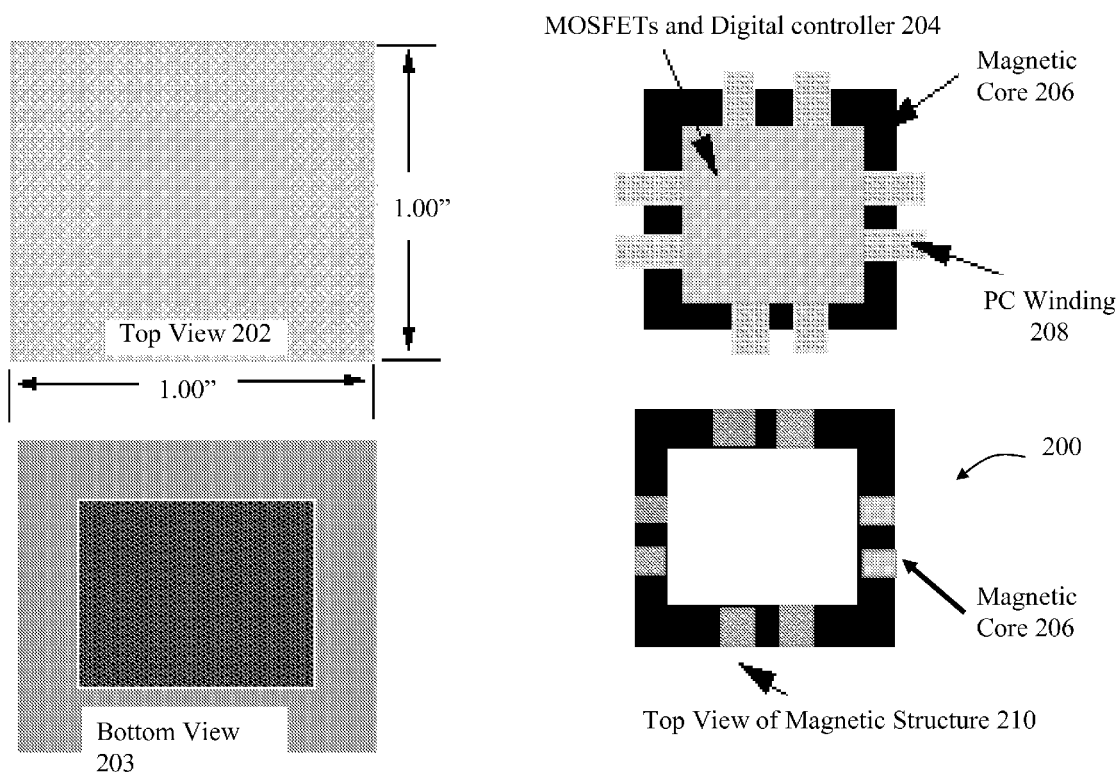
FIG. 2 illustrates an integrated BGA VRM using planar magnetics and single IC using a controller and 4 MOSFETs which is an implementation of the regulator of the present invention.

FIG. 2 illustrates an integrated BGA VRM (see top and bottom views 202, 203) using planar magnetics (magnetic core 206) and single IC using a controller and 4 MOSFETs 204 which is an implementation of the regulator of the present invention. A ball grid array (BGA) is a type of surface-mount packaging used for integrated circuits. The BGA is descended from the pin grid array (PGA), which is a package with one face covered (or partly covered) with pins in a grid pattern. These pins are used to conduct electrical signals from the integrated circuit to the printed circuit board (PCB) it is placed on. In a BGA, the pins are replaced by balls of solder stuck to the bottom of the package. The device is placed on a PCB that carries copper pads in a pattern that matches the solder balls. The assembly is then heated, either in a reflow oven or by an infrared heater, causing the solder balls to melt. Surface tension causes the molten solder to hold the package in alignment with the circuit board, at the correct separation distance, while the solder cools and solidifies.

The BGA is a solution to the problem of producing a miniature package for an integrated circuit with many hundreds of pins. Pin grid arrays and dual-in-line surface mount (SOIC) packages were being produced with more and more pins, and with decreasing spacing between the pins, but this was causing difficulties for the soldering process. As package pins got closer together, the danger of accidentally bridging adjacent pins with solder grew. BGAs do not have this problem, because the solder is sometimes factory-applied to the package in exactly the right amount.

A further advantage of BGA packages over packages with discrete leads (i.e., packages with legs) is the lower thermal resistance between the package and the PCB. This allows heat generated by the integrated circuit inside the package to flow more easily to the PCB, preventing the chip from overheating.

The shorter an electrical conductor, the lower its inductance, a property which causes unwanted distortion of signals in high-speed electronic circuits. BGAs, with their very short distance between the package and the PCB, have low inductances and therefore have far superior electrical performance to leaded devices. PBGAs utilize a plastic substrate material to which the array is attached.

The Multilayer PC board provides the winding 208 on a PBGA board. The metal plate with IC attached is the heat carrier for the DC-DC regulator. The PC board with winding layers 208 and SMD ceramic capacitors (318—FIG. 3) is sandwiched by ferrite cores 206. Semiconductor devices used for the construction provide 92% efficiency at 1 Mhz frequency. The digital controller (320—FIG. 3) avoids using all discrete components. The package of the present invention allows very high density system boards with complex functions in a small space considering 4 to 5 VRMs required and the size being ⅕ of the prior art.

As was noted above, the invention is based on a single VRM chip, PBGA multilayer board which processor signal pads and power points. The multilayer board periphery has SMD components such as ceramic capacitors, ICs, MOSFETs and a rectangular metal heat sink along with ferrite cores to form inductors for the multiphase solution.

Figure 3:
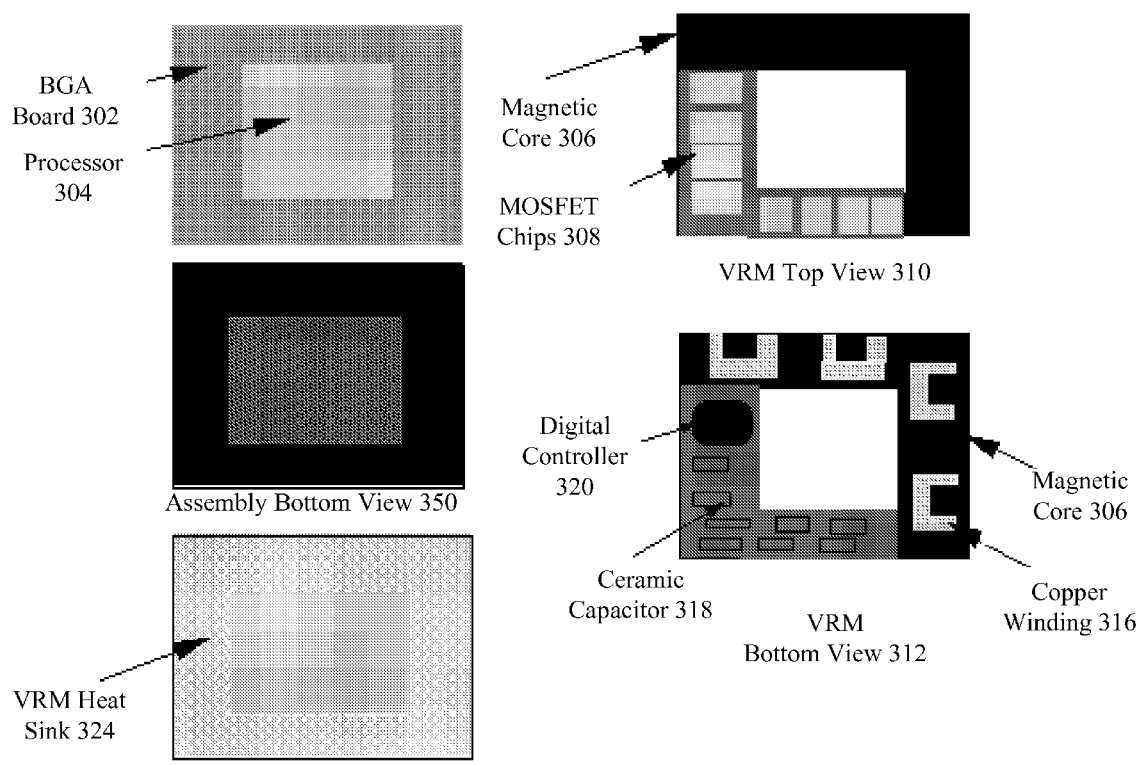
FIG. 3 shows various components of the assembly according to the present invention.

FIG. 3 shows various components of the assembly 300—a BGA board 302, a processor chip 304, the VRM heat sink 324, the magnetic core 306, MOSFET chips 308, the control chip (digital controller 308), ceramic capacitor 318 and the multilayer copper winding 316.

The VRM components are mounted around the microprocessor chip 304 on a multilayer board. The output of the regulator directly feeds the power pins of the microprocessor without requiring any external connector. The heat sink assembly 324 is common to the microprocessor 304 and the VRM (see VRM bottom view 312). This combined assembly for VRM and the microprocessor 304 with the common heat sink 324 frees up the space for other functions in a given space. Considering integration and better cooling, the assembly of the present invention has a very high reliability and there will be no need for a plug-in VRM modules as is the case today.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

I claim:

1. An integrated voltage regulator module (VRM) and microprocessor assembly comprising:
    a multilayer PC board;
    a microprocessor mounted to the multilayer PC board;
    a VRM mounted on the multilayer PC board connected to the microprocessor and for regulating a voltage provided to the microprocessor, the VRM comprising at least one magnetic core and a plurality of surface-mount devices (SMDs) mounted along a periphery of the multilayer PC board; and
    a VRM heat sink connected to the microprocessor and the VRM, wherein the VRM heat sink is connected to the at least one magnetic core and the plurality of SMDs mounted along the periphery of the multilayer PC board;
    wherein the VRM has an output and the microprocessor has power pins for receiving voltage from the VRM output, wherein the output directly feeds the power pins of the microprocessor without requiring any external connector.

2. The integrated VRM and microprocessor assembly of claim 1 wherein the integrated VRM and microprocessor assembly has at least two magnetic cores which sandwich the multilayer PC board having the SMDs mounted thereon.

3. The integrated VRM and microprocessor assembly of claim 2 wherein the SMDs comprise at least a digital controller, MOSFET chips and at least one ceramic capacitor mounted to the multilayer PC board.

4. The integrated VRM and microprocessor assembly of claim 3 further comprising at least one copper winding mounted to the multilayer PC board.

5. The integrated VRM and microprocessor assembly of claim 1 wherein the micropocessor is mounted in or near a center of the multilayer PC board and SMDs are mounted around the microprocessor.

6. The integrated VRM and microprocessor assembly of claim 1 wherein the multilayer PC board is a ball grid array (BGA).

7. The integrated VRM and microprocessor assembly of claim 6 wherein the BGA has a plastic substrate material to which the array is attached.

8. The integrated VRM and microprocessor assembly of claim 3 wherein there are four (4) MOSFETs.

9. The integrated VRM and microprocessor assembly of claim 3 wherein the SMDs further include one or more integrated circuits (ICs).

* * * * *